US008423845B2

(12) United States Patent
Hapke et al.

(10) Patent No.: US 8,423,845 B2
(45) Date of Patent: Apr. 16, 2013

(54) ON-CHIP LOGIC TO LOG FAILURES DURING PRODUCTION TESTING AND ENABLE DEBUGGING FOR FAILURE DIAGNOSIS

(75) Inventors: Friedrich Hapke, Winsen (DE); Juergen Schloeffel, Buchholz/Sproetze (DE); Michael Wittke, Pinneberg (DE); Rene Krenz-Baath, Hamburg (DD)

(73) Assignee: Mentor Graphics Corporation, Wilsonville, OR (US)

( * ) Notice: Subject to any disclaimer, the term of this patent is extended or adjusted under 35 U.S.C. 154(b) by 398 days.

(21) Appl. No.: 12/629,036

(22) Filed: Dec. 1, 2009

(65) Prior Publication Data

US 2011/0047425 A1    Feb. 24, 2011

Related U.S. Application Data

(60) Provisional application No. 61/119,006, filed on Dec. 1, 2008.

(51) Int. Cl.
*G01R 31/28* (2006.01)

(52) U.S. Cl.
USPC .............................. 714/732; 714/729; 714/733

(58) Field of Classification Search .................. 714/726, 714/727, 729, 732, 733
See application file for complete search history.

(56) References Cited

U.S. PATENT DOCUMENTS

| | | | | |
|---|---|---|---|---|
| 6,009,539 | A * | 12/1999 | Ranson ............................. | 714/30 |
| 6,373,310 | B1 * | 4/2002 | Jacobs ........................... | 327/217 |
| 6,424,926 | B1 * | 7/2002 | Mak ............................... | 702/117 |
| 6,901,546 | B2 * | 5/2005 | Chu et al. ....................... | 714/738 |
| 7,032,148 | B2 * | 4/2006 | Wang et al. .................... | 714/729 |
| 7,058,869 | B2 * | 6/2006 | Abdel-Hafez et al. ........ | 714/729 |
| 7,552,373 | B2 * | 6/2009 | Wang et al. .................... | 714/726 |
| 7,945,833 | B1 * | 5/2011 | Wang et al. .................... | 714/729 |
| 7,979,684 | B2 * | 7/2011 | Lin et al. ....................... | 712/228 |

OTHER PUBLICATIONS

Dervisoglu, B.I.; , "Application of scan hardware and software for debug and diagnostics in a workstation environment," Computer-Aided Design of Integrated Circuits and Systems, IEEE Transactions on , vol. 9, No. 6, pp. 612-620, Jun. 1990.*
Yu Huang; Wu-Tung Cheng; Rajski, J.; , "Compressed pattern diagnosis for scan chain failures," Test Conference, 2005. Proceedings. ITC 2005. IEEE International , vol., No., pp. 8 pp. 751, 8-8 Nov. 2005.*
Devanathan, V.R.; Ravikumar, C.P.; Kamakoti, V.; , "Glitch-Aware Pattern Generation and Optimization Framework for Power-Safe Scan Test," VLSI Test Symposium, 2007. 25th IEEE , vol., No., pp. 167-172, May 6-10, 2007.*
Lang, H.; Pfeiffer, J.; Maguire, J.; , "Using on-chip test pattern compression for full scan SoC designs ," Test Conference, 2000. Proceedings. International , vol., No., pp. 638-643, 2000.*

* cited by examiner

*Primary Examiner* — Cynthia Britt

(57) ABSTRACT

On-chip logic includes a shadow register cross-coupled with a multiple input shift/signature register (MISR). The shadow register facilitates debugging by shifting out a test signature while resetting the MISR with a fault-free signature. The on-chip logic may further include comparator circuitry to produce an output signal by comparing the test signature with the fault-free signature or by first compressing the test signature and then comparing the compressed test signature with the compressed fault-free signature.

12 Claims, 3 Drawing Sheets

ON-CHIP LOGIC TO LOG FAILURES DURING PRODUCTION TESTING AND ENABLE DEBUGGING FOR FAILURE DIAGNOSIS

RELATED APPLICATIONS

This application claims priority to U.S. Provisional Patent Application No. 61/119,006, entitled "On-Chip Logic To Log Failures During Production Testing And Enable Debugging For Failure Diagnosis," filed on Dec. 1, 2008, and naming Friedrich Hapke et al. as inventors, which application is incorporated entirely herein by reference.

FIELD OF THE INVENTION

The present invention is directed to techniques for performing fault diagnosis in integrated circuits (ICs) with built-in self-test (BIST) circuitry.

BACKGROUND OF THE INVENTION

As integrated circuits continue to develop, they continue to have higher device densities and clocking rates. As a result, it requires ever-increasing numbers of test vectors to properly test them, which in turn requires larger and larger amounts of tester vector memory. Still further, manufacturing newer integrated circuits requires even more complex manufacturing techniques, with the corresponding increase in problems and costs related to the production of integrated circuits. To address these problems, and to allow for a self-test of integrated circuits in the field, a testing technique referred to as "built-in self-test" (BIST) is expected to be used more and more in the future.

With logic built-in self-test (LBIST), test circuits for testing the functional logic of an integrated circuit are added to the circuit's design. FIG. 1 illustrates the general configuration of an integrated circuit using LBIST. As seen in this figure, an integrated circuit 101 includes a test stimulus generator 103, a circuit-under-test (CUT) 105, and a test response evaluator 107. The integrated circuit 101 also includes a test control module 109, for controlling the operation of the test stimulus generator 103, the circuit-under-test (CUT) 105, and the test response evaluator 107. With this arrangement, the test stimulus generator 103 generates test stimuli that are applied to the circuit-under-test 105 through scan chains. The scan chains may be, for example, flip-flops in the circuit-under-test 105 that can be configured into serial shift registers during a test mode.

The self-test is performed by repeatedly shifting the generated test stimuli into the scan chains so that they are applied to the circuit-under-test 105, and operating the circuit-under-test 105 for a number of clock cycles in its functional application mode. Various techniques for generating efficient stimuli are well-known in the art. These include, for example, techniques for generating test stimuli for built-in self-test applications that improve the random testability of the circuit by state-of-the-art test points insertion (TPI), by a linear feedback shift register (LFSR) reseeding, by Bit-Flipping-Logic (see, for example, U.S. Pat. No. 6,789,221, issued Sep. 7, 2004, which patent is incorporated entirely herein by reference), or by a cycle-based stimuli generation (see, for example, European Patent Application No. 06126627.6, filed on Dec. 20, 2006, which application is incorporated entirely herein by reference as well).

The responses produced by the circuit-under-test 105 are captured by the scan chains, and relayed to the test response evaluator 107 where, for example, they are compacted on-chip using a compacting device, such as a multiple input shift register (MISR), to produce a compacted test signature, as illustrated in FIG. 2. The compacted test signature can then be compared against a corresponding fault-free signature to determine if the integrated circuit has any of the faults tested for by the test stimuli. Depending upon the implementation, the compacted test signature can be compared with the fault-free signature on-chip, or after it has been exported off of the integrated circuit for comparison by, for example, automated test equipment. When a MISR is employed, however, all the values which appear during the entire test sequence at the scan-chain-outputs are compacted into one final MISR signature. As a result, it is very difficult to calculate the position of the fault in the circuit-under-test when a faulty signature does occur. Thus, while using a standard MISR-type structure readily indicates the presence of a fault, it does not allow for an efficient debug and diagnosis of the circuit-under-test.

BRIEF SUMMARY OF THE INVENTION

Aspects of the invention relate to techniques for performing fault diagnosis in integrated circuits (ICs) with built-in self-test (BIST) circuitry, without the need to test the IC with a special diagnosis pattern. According to various implementations of the invention, a cross-coupled shadow register is combined with a MISR. All fault-free MISR-signatures then are precomputed for every pattern, and all faulty MISR-signatures are precomputed for every fault identified by each pattern. Additionally, various implementations of the invention address the problem of storing the complete design data for many years, enabling a precise fault diagnosis just by using the precomputed MISR-signatures already stored in a dictionary. Furthermore, various implementations of the invention address the problem of long diagnosis runtimes. During a diagnosis, only pre-calculated MISR-signatures are looked-up, instead of performing time-consuming logic simulation or fault simulation as in previous approaches. Various implementations of the invention also address the problem of storing large amounts of diagnosis data by using MISR-signatures only, so that saving the test response data contained in the long concatenated scan chains is unnecessary.

DETAILED DESCRIPTION OF THE INVENTION

Built-in Self-Test System

Figure 1:
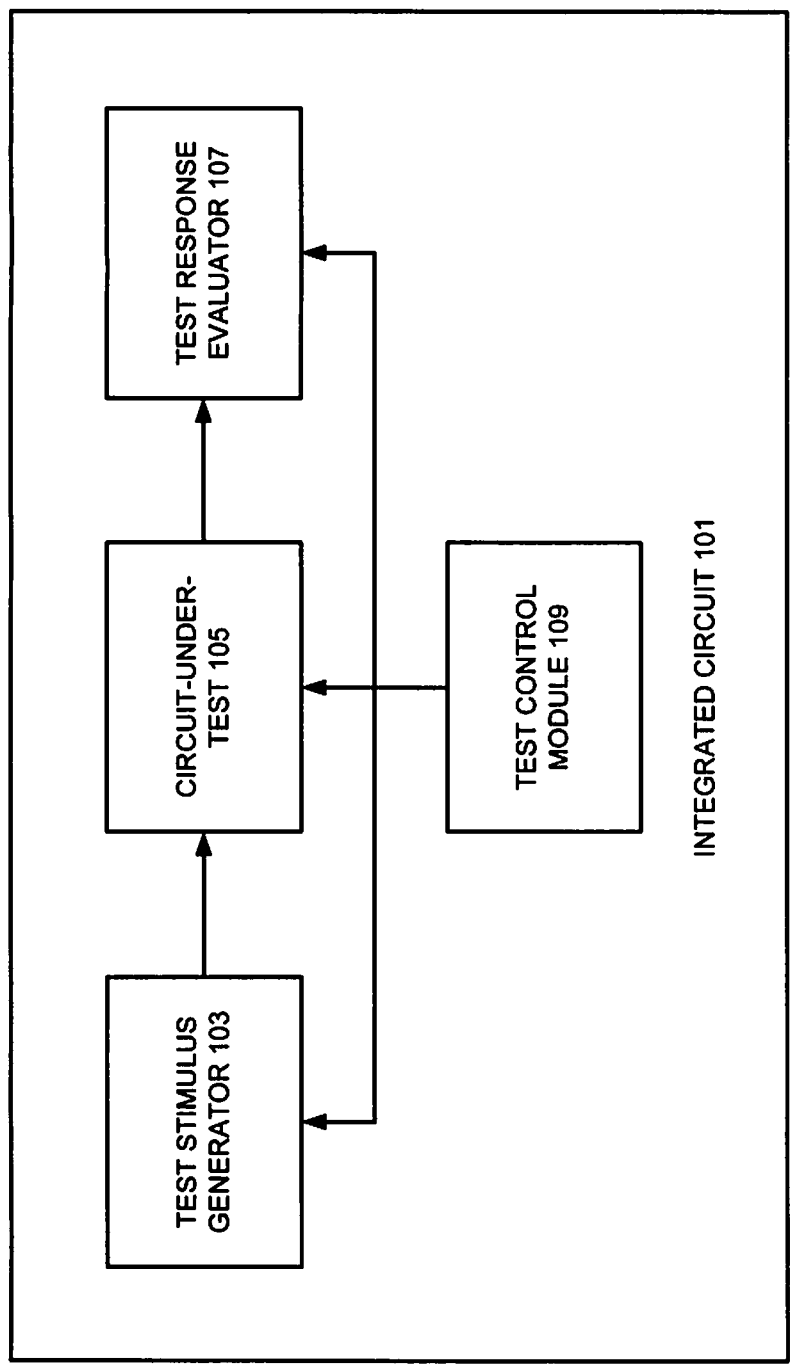
FIG. 1 illustrates the general configuration of an integrated circuit using LBIST.
Figure 2:
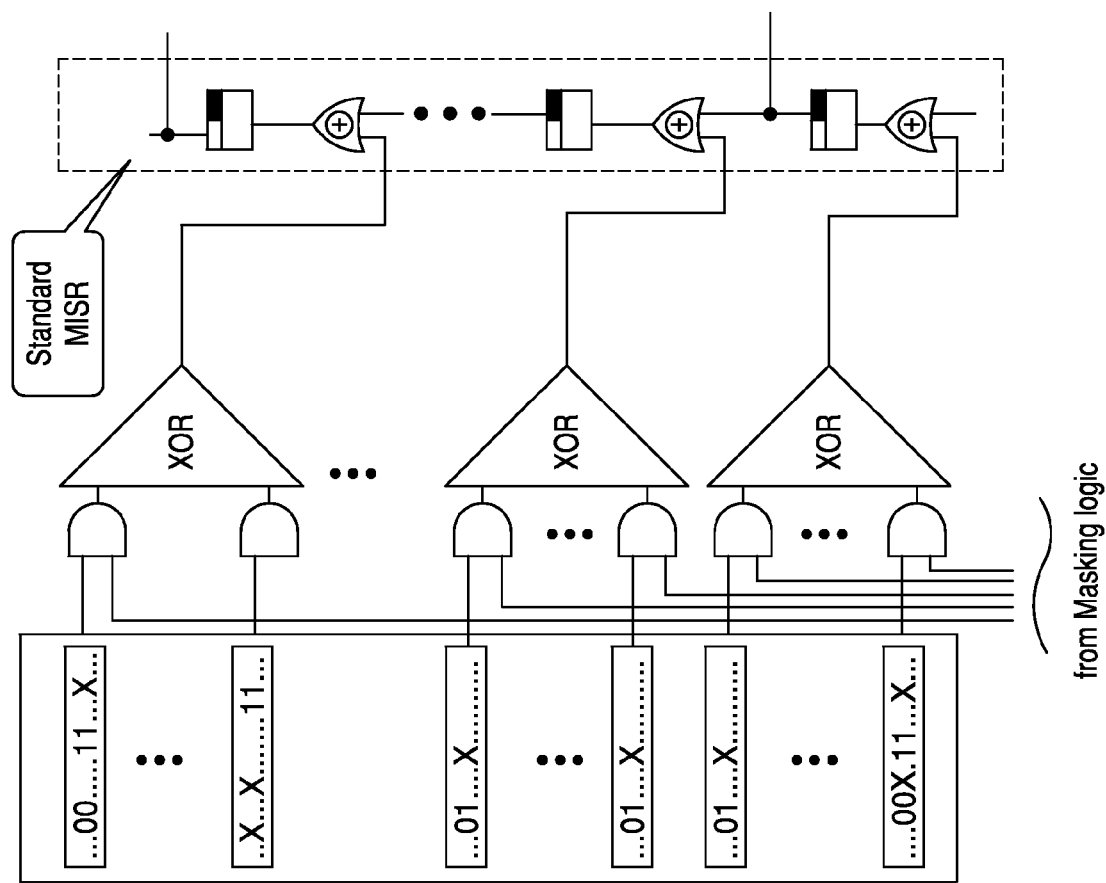
FIG. 2 illustrates an Embedded Deterministic Test (EDT) configuration that employs a MISR to compact test response data provided from scan chains.
Figure 3:
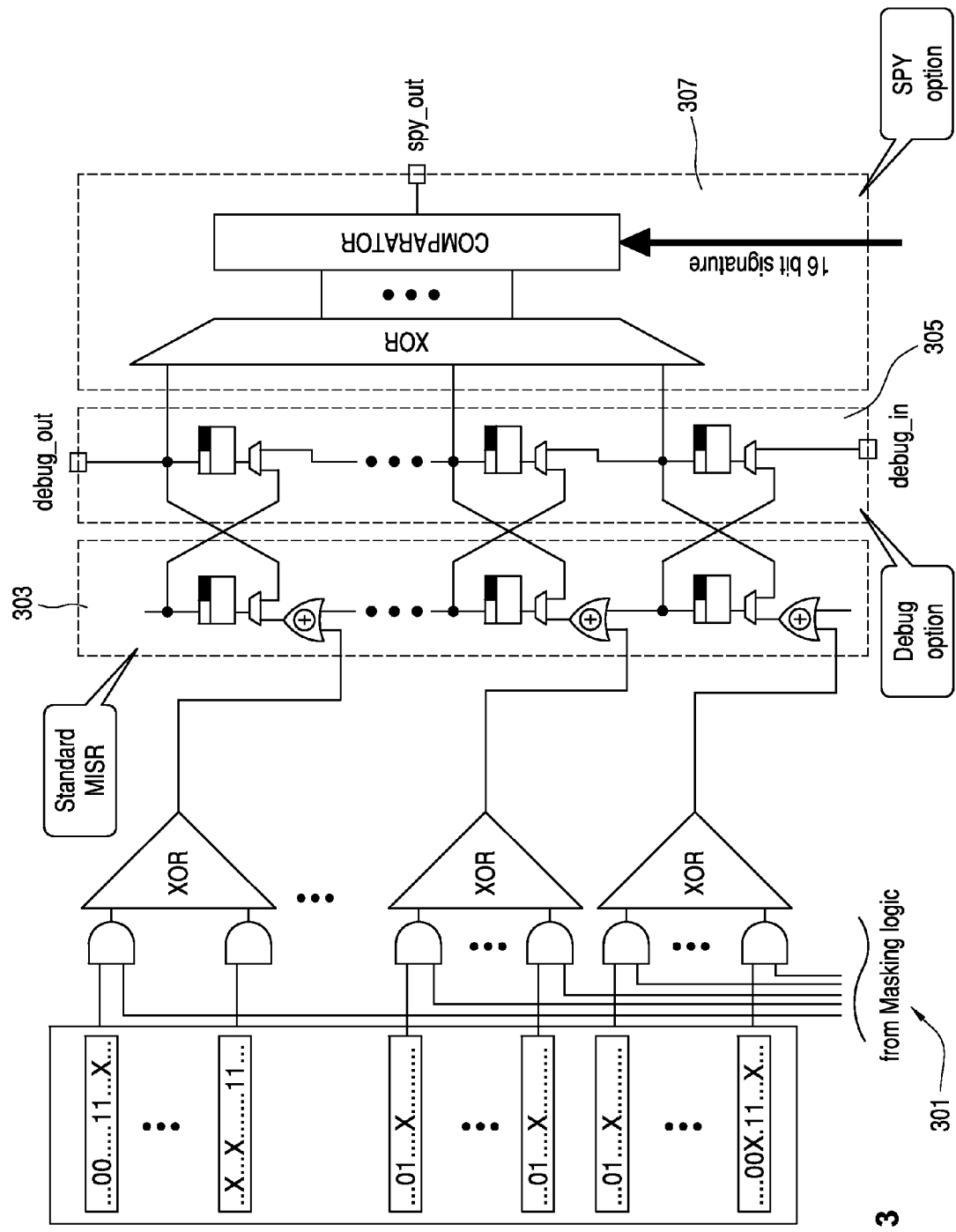
FIG. 3 illustrates an Embedded Deterministic Test (EDT) configuration that employs a MISR, a cross-coupled shadow register, and a secondary compaction circuit according to various implementations of the invention.

FIG. 3 illustrates an Embedded Deterministic Test (EDT) configuration 301 that employs a MISR 303, a cross-coupled shadow register 305, and a secondary compaction circuit 307 according to various implementations of the invention. This EDT configuration 301 may added to any desired integrated circuit. One feature of EDT configuration 301 is that it constantly produces only one output signal, identified herein as "SPY", for the integrated circuit being test. This SPY output (labelled "spy_out" in FIG. 3) always produces, in the fault-free case, a signal with a high logical value (or, with alternate implementations of the invention, a low logical value) during the whole test execution of a Logic BIST using the EDT configuration 301. Hence, it is possible to employ the EDT configuration 301 to run a Logic BIST with only one test vector, which is repeated on the test system for as many cycles (e.g., millions of cycles) as performed during the Logic BIST execution. The constant observation of one output signal, i.e., the SPY-signal, enables the logging of the first failing pattern during production test. This is very important information for statistical failure analysis in mass production in order to improve the yield of integrated circuits. The SPY-signal results from a comparison of the actual MISR-signature and a compressed fault-free MISR-signature that may be stored, for example, on-chip in a BIST memory circuit, such as a read-only memory (ROM) circuit.

Further, the illustrated example of the EDT configuration 301 according to various implementations of the invention contains the integration of a debug-register 305, which is cross-coupled with the MISR 303, in order to perform a detailed failure analysis. This additional debug-register 305 allows shifting-out of the actual (faulty) MISR-signature while at the same time allowing the fault-free MISR-signature for the next test pattern to be shifted in. The debug register 305 may run with a lower frequency than the on-chip BIST frequency, allowing the input data and output data to be shifted out from and shifted into the debug register 305 via a slower integrated circuit contact pad. It should be appreciated, however, that the single-step debug operation may be omitted with various embodiments of the invention. The debug test patterns need only to shift-in and shift-out the corresponding MISR-bits, and all other cycles can be compressed on the test system to one single test vector per on-chip-stored BIST pattern.

Various implementations of the invention thus allow for an efficient fault diagnosis based only on data that is available during production test. Hence, time-consuming extra tests for diagnosis purposes may be omitted with various embodiments of the invention. Instead, it may be sufficient to only shift-out the small MISR-signature instead of shifting-out the complete set of flip-flop-responses of the IC (e.g., 32 bits per pattern instead of 1 million bits per pattern). Although requiring a tremendously reduced amount of test data, various implementations of the invention can provide a sufficiently high diagnosis resolution. As discussed above, various implementations of the invention employ pre-computations, which generate a fault dictionary containing the fault-free MISR-signatures for all test patterns and a set of MISR-signatures corresponding to every single fault or a set of faults which might occur in the circuit-under-test.

In order to support the SPY-functionality, the fault-free signatures may be further compressed (e.g., 16 bit), and may either be stored on-chip, as shown in FIG. 3, or provided by the test system. In addition, various implementations of the invention enable multi-site testing with a large number of concurrently tested integrated circuits, because only one signal (labelled "spy_out" in FIG. 3) need be observed per integrated circuit. In the case of a failing test pattern and hence a resulting faulty MISR-signature, it is possible to easily extract a set of fault candidates from the previously generated fault dictionary. In debug mode, the resulting MISR-signature is constantly shifted-out, and the fault-free MISR-signature is constantly shifted-in for every test pattern.

CONCLUSION

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims. For example, while specific implementations of the invention have been discussed with regard to logic built-in self-test techniques, it should be appreciated that implementations of the invention also may be employed with other types of built-in self-test techniques, such as memory built-in self-test (MBIST) techniques.

What is claimed is:

1. A method of collecting test data, comprising:
   compacting test data to generate a test signature for a test pattern with a compacting device;
   transferring the test signature from the compacting device to a debug register, the debug register being cross-coupled with the compacting device;
   transferring a compacting device signature from the debug register to the compacting device; and
   shifting the test signature out from the debug register.

2. The method recited in claim 1, wherein:
   the compacting device is a multiple input shift/signature (MISR) register.

3. The method recited in claim 1, wherein:
   the test data are obtained by compressing scan chain output data.

4. The method recited in claim 1, wherein:
   the compacting device signature is a fault-free test signature for the test pattern.

5. The method recited in claim 1, further comprising:
   transferring the test signature to comparator circuitry, the comparator circuitry being connected with the debug register; and
   generating an output signal based on the test signature with the comparator circuitry.

6. The method recited in claim 5, wherein:
   the comparator circuitry includes a compressor and a comparator, and the comparator receives a compressed fault-free test signature.

7. The method recited in claim 6, wherein:
   the compressed fault-free signature is stored in a read-only memory circuit.

8. A test data collection device, comprising:
   a compacting device configured to generate a test signature based on test data; and
   a debug register being cross-coupled to the compacting device.

9. The test data collection device recited in claim 8, further comprising:
   comparator circuitry connected to the debug register and configured to generate an output signal based on the test signature and information related to a fault-free signature.

10. The test data collection device recited in claim 9, wherein:
    the comparator circuitry includes a compressor and a comparator, the compressor being connected to the debug register; and
    the information related to a fault-free signature is a compressed fault-free signature.

11. The test data collection device recited in claim 8, wherein:
    the compacting device is a multiple input shift/signature (MISR) register.

12. The test data collection device recited in claim 8, wherein:

the debug register is configured to shift out the test signature received from the compacting device through an output port and to shift in a compacting device signature through an input port.

* * * * *